(12) United States Patent
Lee

(10) Patent No.: US 7,686,888 B2
(45) Date of Patent: Mar. 30, 2010

(54) COOLING SYSTEM FOR CHAMBER OF INGOT GROWTH ARRANGEMENT

(75) Inventor: Jong Gu Lee, Bucheon-si (KR)

(73) Assignee: Qualiflownaratech Co., Ltd., Gyeonggi-do (KR)

( * ) Notice: Subject to any disclaimer, the term of this patent is extended or adjusted under 35 U.S.C. 154(b) by 61 days.

(21) Appl. No.: 11/791,178

(22) PCT Filed: Nov. 14, 2005

(86) PCT No.: PCT/KR2005/003854

§ 371 (c)(1),
(2), (4) Date: Nov. 27, 2007

(87) PCT Pub. No.: WO2006/052114

PCT Pub. Date: May 18, 2006

(65) Prior Publication Data

US 2008/0202721 A1    Aug. 28, 2008

(30) Foreign Application Priority Data

Nov. 15, 2004    (KR) .................. 10-2004-0093165

(51) Int. Cl.
C30B 13/00    (2006.01)
C30B 21/04    (2006.01)
(52) U.S. Cl. .............. 117/222; 117/200; 117/202; 117/223; 117/224; 249/79
(58) Field of Classification Search ......... 117/200–224, 117/900; 249/79
See application file for complete search history.

(56) References Cited

U.S. PATENT DOCUMENTS 6,572,700 B2    6/2003   Kawase et al.

FOREIGN PATENT DOCUMENTS

| JP | 63-166795 | 7/1988 |
|---|---|---|
| JP | 11-011924 | 1/1999 |
| JP | 2000-344592 | 12/2000 |
| KR | 10-2002-0045765 | 6/2002 |
| KR | 1020030040713 | 5/2003 |
| KR | 10-2003-0044573 | 6/2003 |

OTHER PUBLICATIONS

1) International Search Report mailed on Feb. 28, 2006 by the Korean Intellectual Property Office in counterpart foreign application No. PCT/KR2005/003854; and 2) International Preliminary Report on Patentability completed Jul. 26, 2006 by the Korean Intellectual Property Office in counterpart foreign application No. PCT/KR2005/003854.

*Primary Examiner*—Robert M Kunemund
*Assistant Examiner*—G. Nagesh Rao
(74) *Attorney, Agent, or Firm*—Abelman, Frayne & Schwab

(57) ABSTRACT

Disclosed herein is a cooling system for a chamber of an ingot growth apparatus. In the present invention, guide blades (180) are provided in a base plate (100) at positions adjacent to unevenly curved parts of a guide line (170), which is the base plate (100), and along which cooling water flows. Furthermore, guide blades (360) are provided in a lid (300) at positions adjacent to ports, which are provided in the lid (300) and interfere with the flow of cooling water. As such, in the present invention, the guide blades are provided in the base plate (100) and the lid (300), which define the chamber, at positions at which cooling water creates stationary vortices, thus solving a problem of water stagnation, thereby increasing a cooling effect.

8 Claims, 8 Drawing Sheets

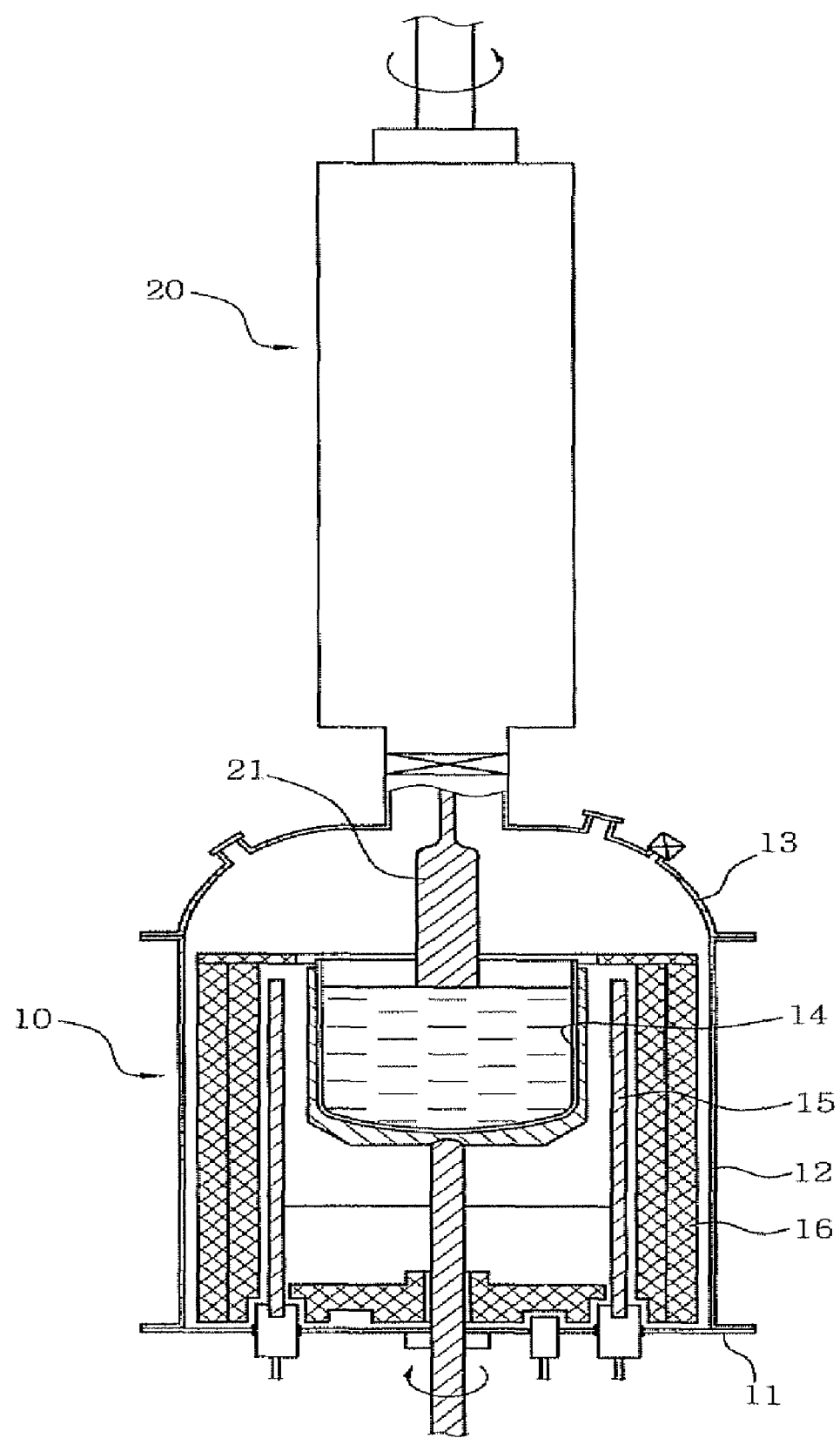
[Fig. 1]

[Fig. 2]
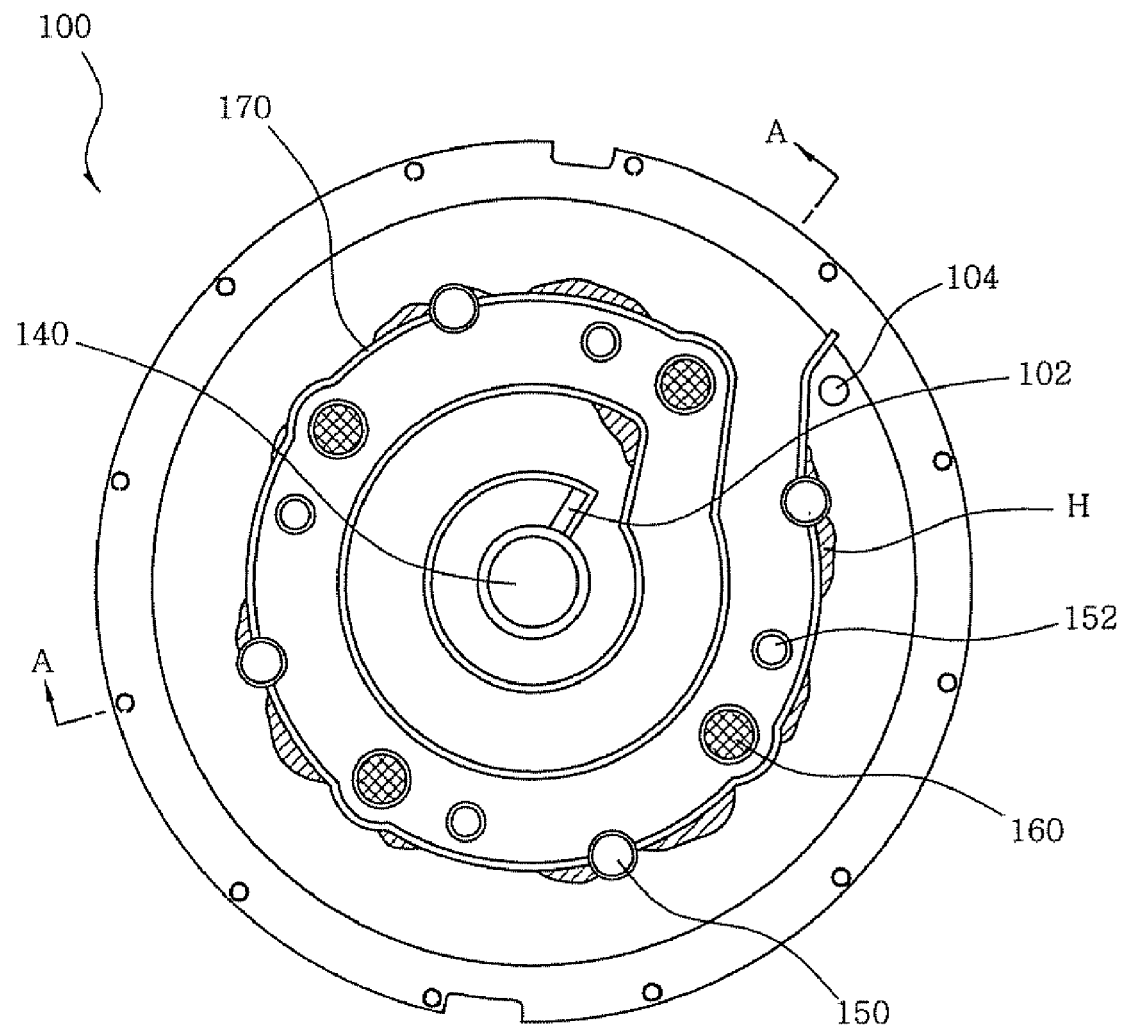
[Fig. 3]
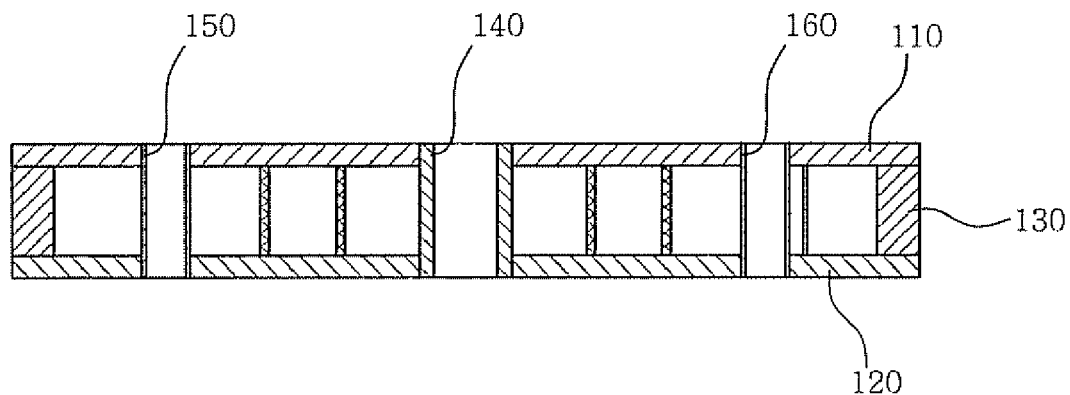

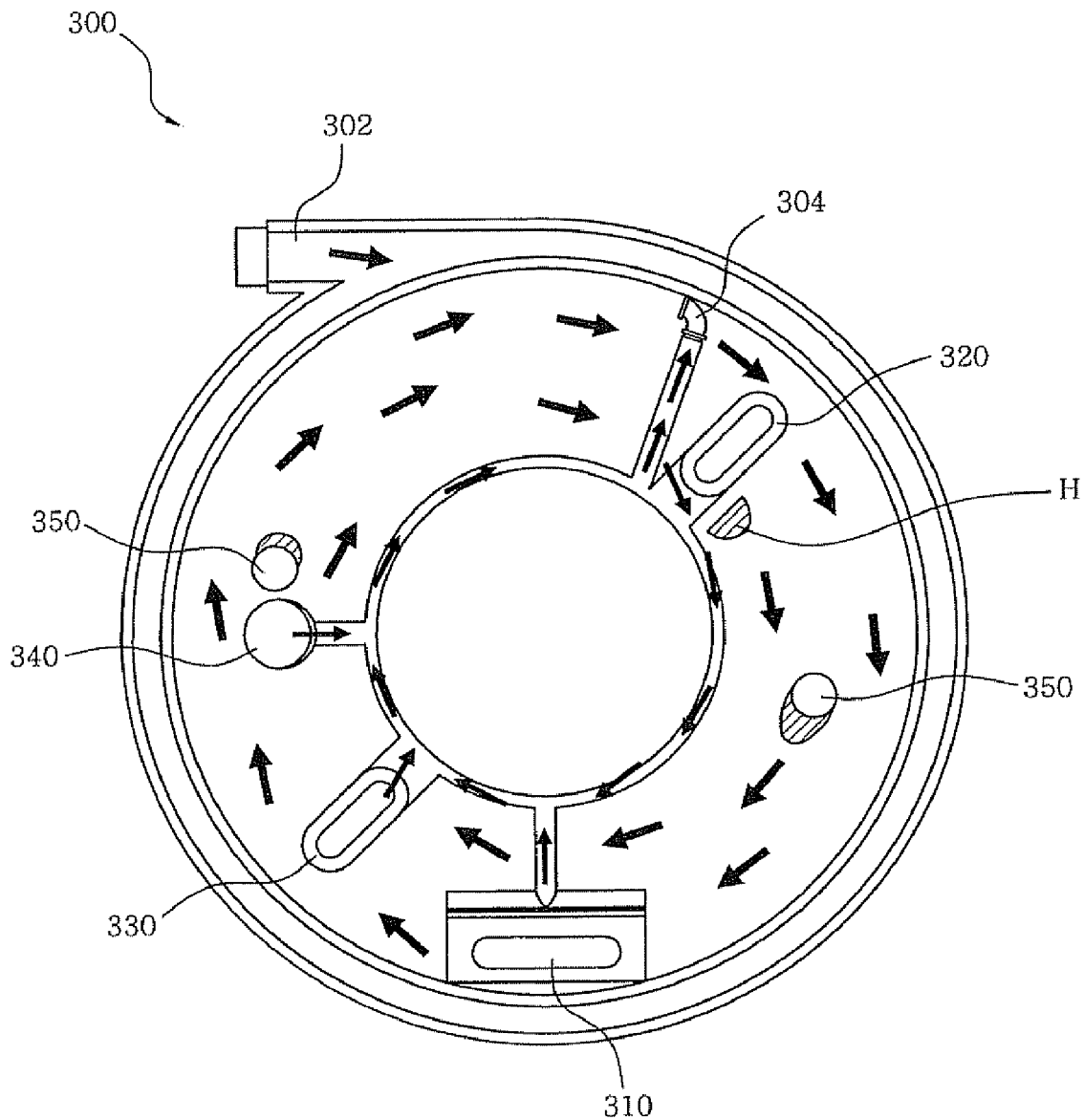
[Fig. 4]

[Fig. 5]
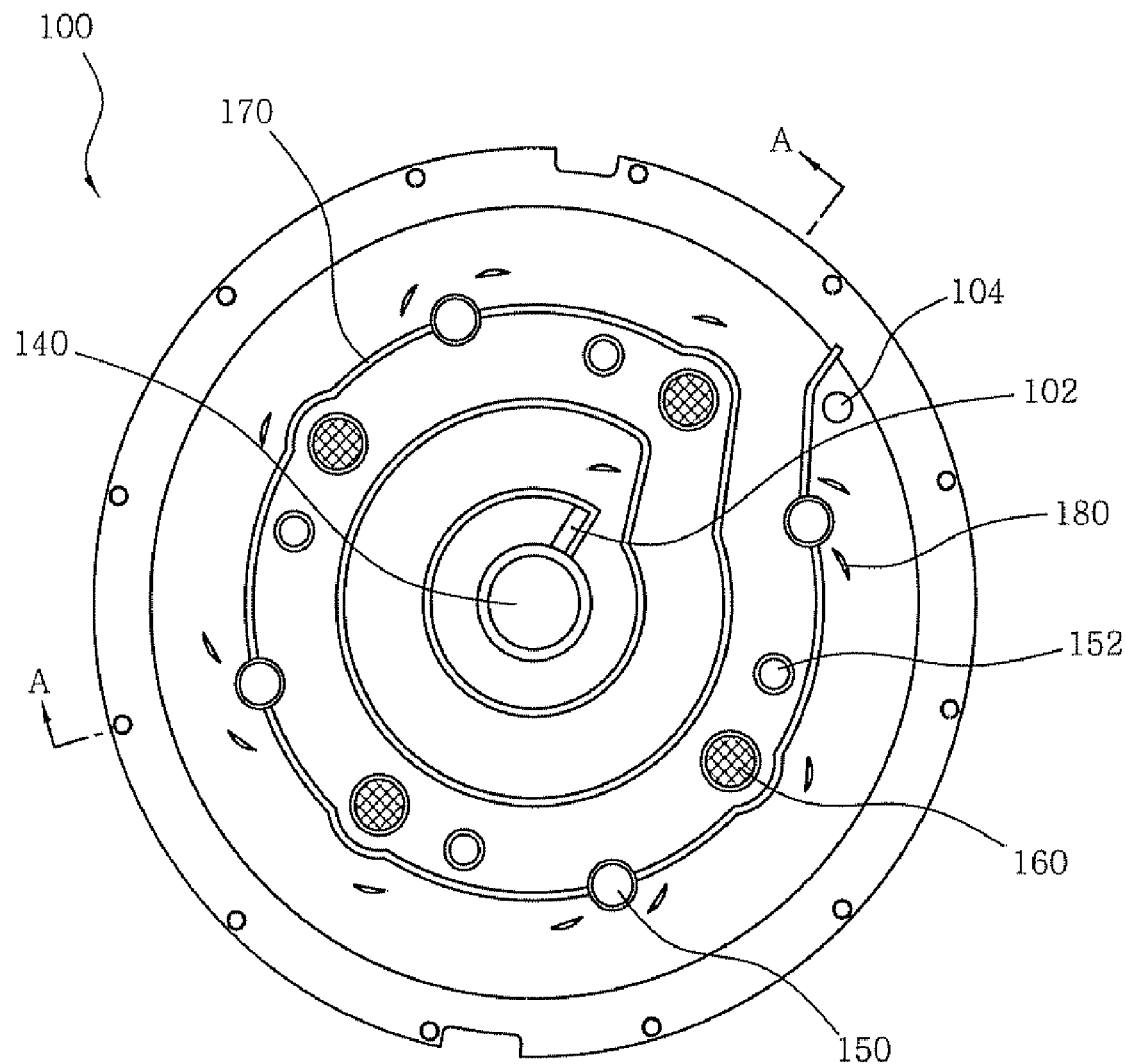
[Fig. 6]
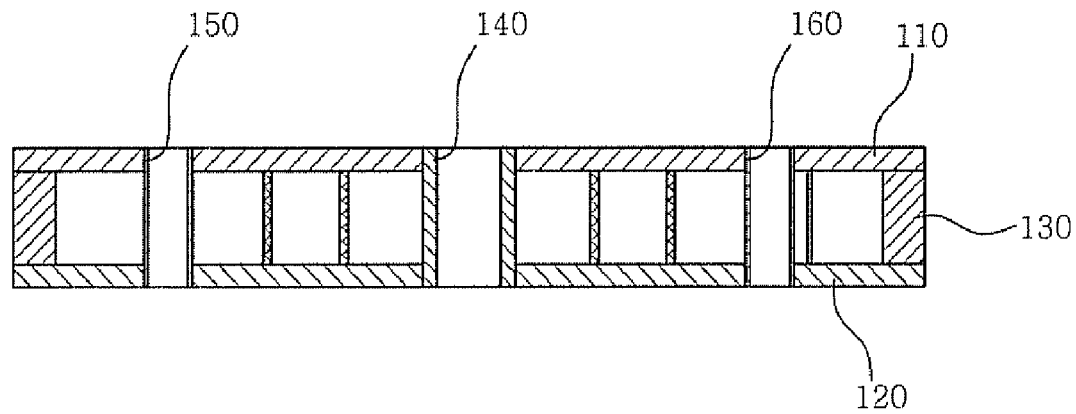

[Fig. 7]
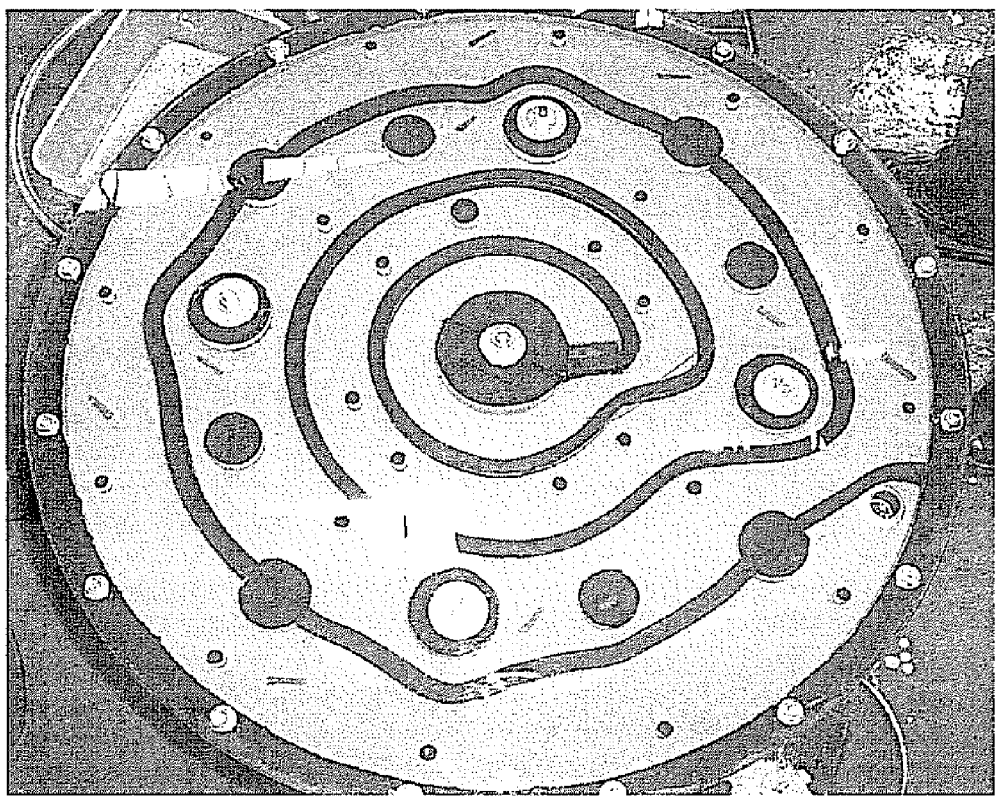
[Fig. 8]
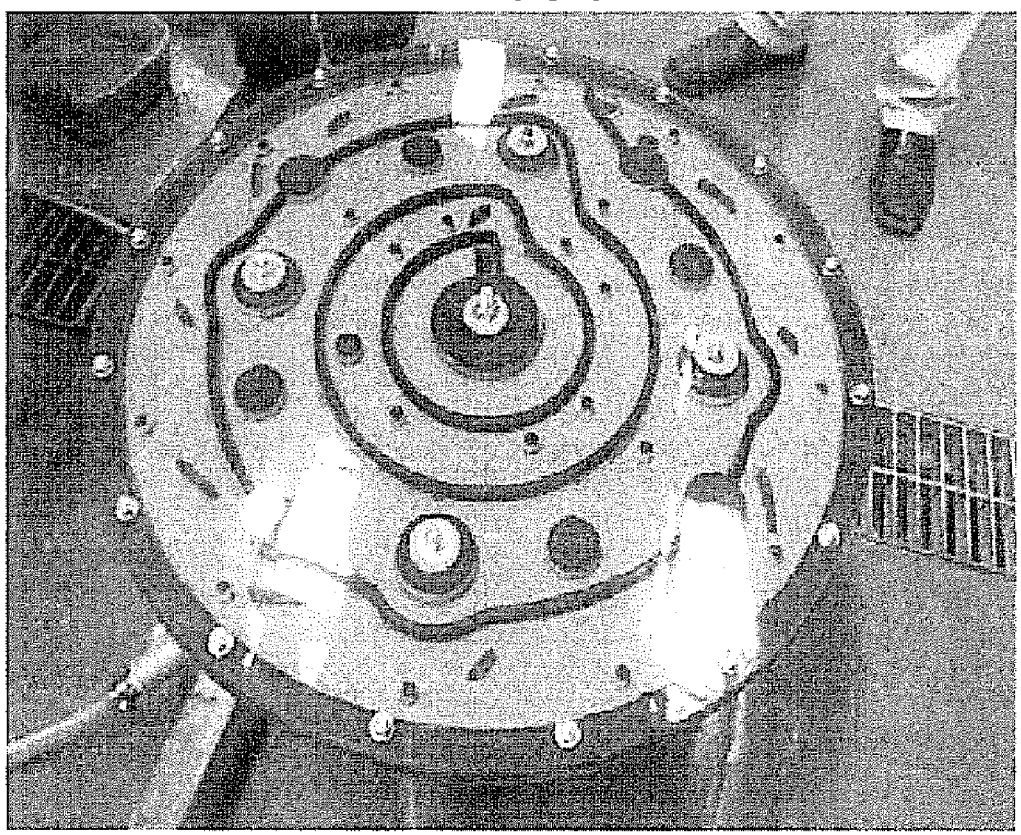

[Fig. 9]
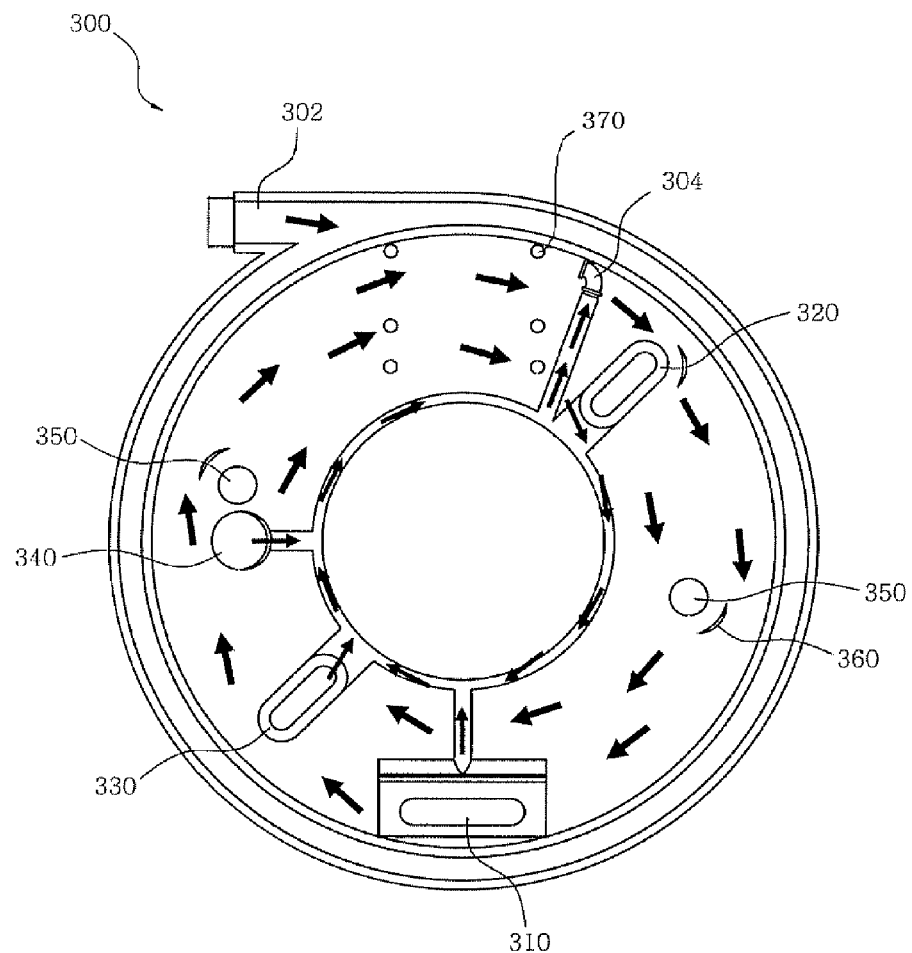
[Fig. 10]

[Fig. 11]
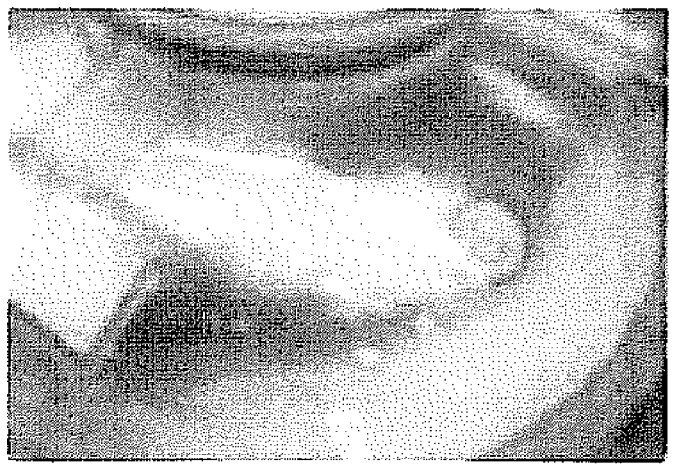
[Fig. 12]
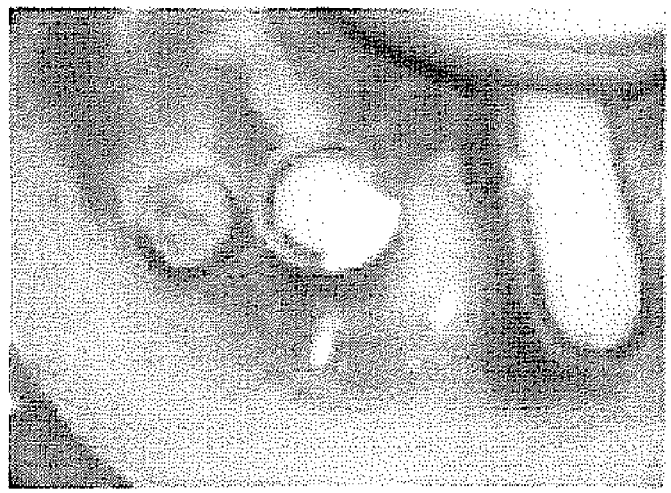
[Fig. 13]
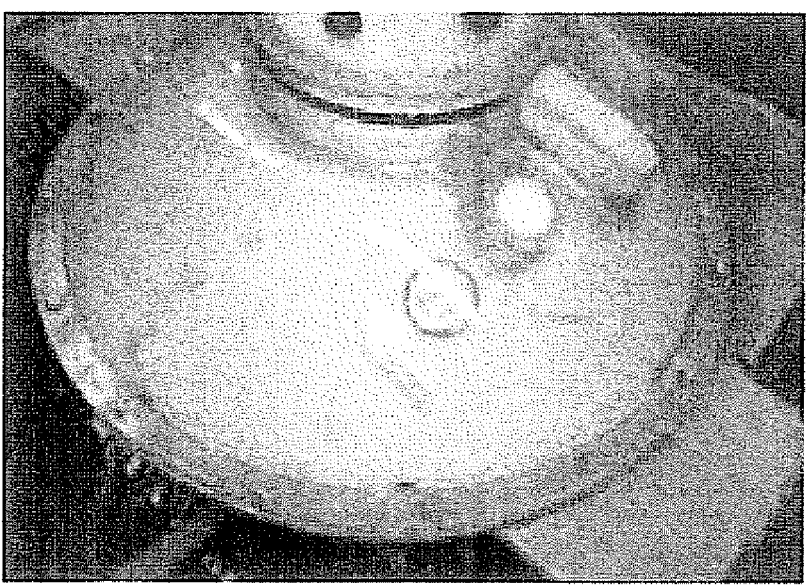

[Fig. 14]
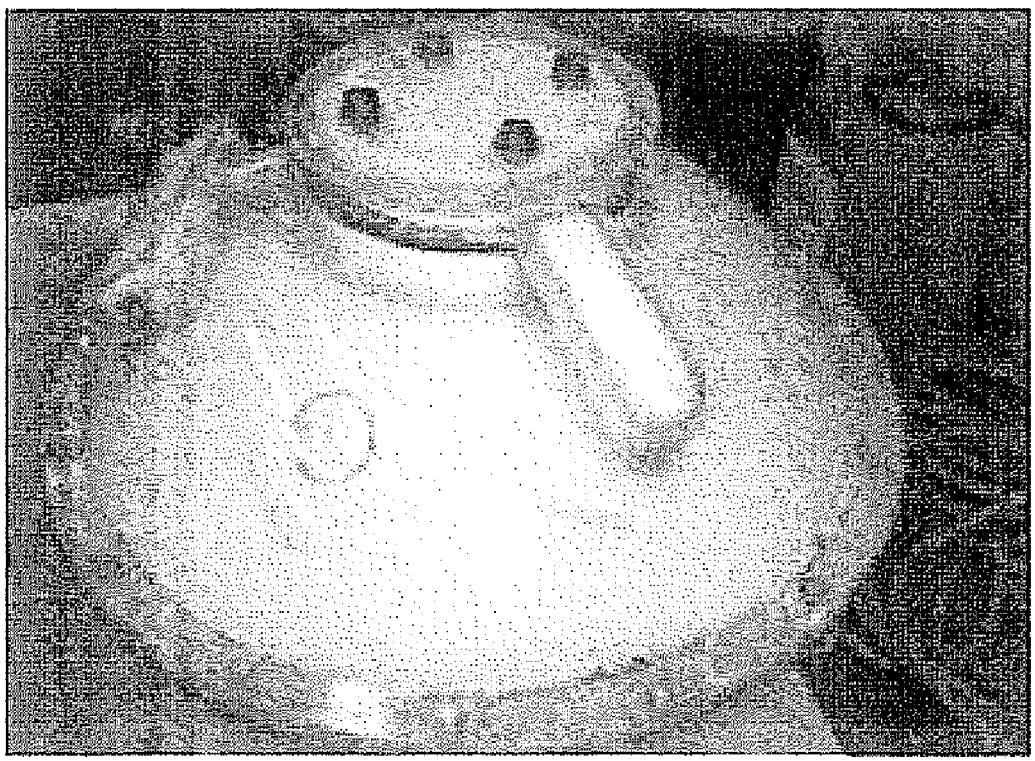
[Fig. 15]
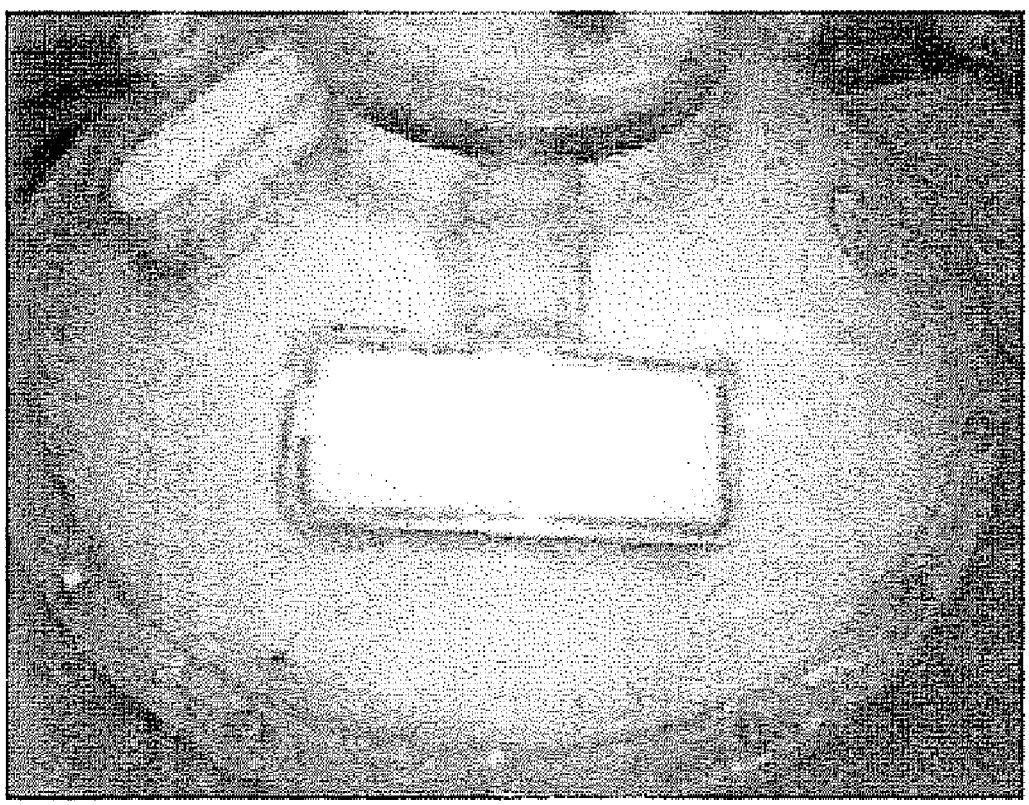

COOLING SYSTEM FOR CHAMBER OF INGOT GROWTH ARRANGEMENT

CROSS REFERENCE-FOREIGN PRIORITY

This application is a 371 of PCT/KR/2005/003854 filed Nov. 14, 2005 and claims foreign priority to 10-2004-0093165 filed Nov. 15, 2004 in the Republic of Korea

TECHNICAL FIELD

The present invention relates, in general, to ingot growth apparatuses and, more particularly, to a cooling system for a chamber of an ingot growth apparatus in which guide blades are provided in a base plate and a lid, which define the chamber, thus providing a superior cooling effect.

BACKGROUND ART

Generally, as shown in FIG. 1, a silicon ingot growth apparatus includes a chamber unit 10, in which polysilicon is melted, and a growth tower unit 20, in which the molten polysilicon is brought into contact with a seed crystal, which slowly rises and thus grows as a silicon ingot having a predetermined diameter.

Furthermore, a quartz crucible 12, which melts polysilicon, is rotatably installed in the chamber unit 10. A heater 14 is provided outside the quartz crucible to heat it. A thermal shield wall 16 is provided outside the heater to prevent heat from being emitted to the outside of the chamber unit.

Typically, the chamber unit 10, having the above-mentioned construction, includes a base plate, a main body and a lid. Each of the base plate, the main body and the lid has a cooling system therein to prevent it from being heated by the heater.

The base plate of the conventional technique is shown in FIGS. 2 and 3.

Referring to these drawings, the conventional base plate 100 includes an upper plate 110 and a lower plate 120 which are spaced apart from each other by a predetermined distance such that cooling water flows in a space defined between them. The base plate 100 further includes a side plate 130 which forms the sidewall of the base plate 100 and seals it.

Furthermore, a shaft coupling hole 140, through which a shaft to rotate the quartz crucible is inserted, is formed at a central position through the base plate 100. Electrode rod assembly holes 150 and 152, through which electrode rods to heat the quartz crucible are mounted, are formed at predetermined positions through the base plate 100. As well, vacuum creation holes 160, to which a vacuum pump to create a vacuum in the chamber is connected, are formed at predetermined positions through the base plate 100. The electrode rod assembly holes 150 and 152 are classified into the side electrode rod assembly holes 150 and the lower electrode rod assembly holes 152.

The cooling system is provided in the base plate 100 having the above-mentioned structure. In detail, an injection hole 102, through which cooling water is injected into the chamber, is formed in the base plate 100 at a position adjacent to the center thereof. A discharge hole 104, through which the cooling water is discharged, is formed in the base plate 100 at a predetermined position adjacent to the outer edge of the base plate 100. Furthermore, a guide line 170 is provided in the base plate 100, such that the flow path of cooling water, which is injected through the injection hole 102, forms a spiral configuration while the cooling water flows to the discharge hole 104, thus preventing the cooling water from directly and linearly flowing towards the discharge hole 104. Therefore, cooling water, which is injected into the chamber through the injection hole 102, flows along the guide line 170 and evenly spreads throughout the overall area of the base plate 100 before being discharged through the discharge hole 104. Of course, a cooling water circulation system, in which the discharged cooling water is again supplied to the injection hole 102 after passing through a separate process, is provided.

However, in the conventional base plate having the cooling system, because the guide line has an unevenly curved shape due to the electrode rod assembly holes and the vacuum pump connection holes, there is a problem in that stagnation due to vortices occurs near unevenly curved parts of the guide line. Particularly, stagnation mainly occurs in portions (H) indicated by hatching in FIG. 2. Such stagnation causes a partial temperature drop in the chamber, thus resulting in a relatively sudden temperature rise, so that problems, such as defective products, may occur during a production process. Furthermore, with the passage of time, due to metal corrosion, cooling water leakage may occur.

Meanwhile, the lid of the chamber unit according to the conventional technique is shown in FIG. 4.

Referring to this drawing, the conventional lid 300 defines therein a space, in which cooling water flows.

Furthermore, an observation window 310 is provided at a predetermined position in the lid 300 to allow a user to observe the interior of the chamber unit 10. A typical camera port 320, a diameter control port 330, a polysilicon passing port 340, and a lift port 350 are provided at predetermined positions in the lid 300.

The lid 300 having the above-mentioned structure has a cooling system therein. In detail, an injection hole 302, through which cooling water is supplied, is formed at a lower position in the lid 300. A discharge hole 304, through which the cooling water is discharged, is formed at an upper position in the lid 300. Thus, the cooling water, which is injected through the injection hole 302, flows in a clockwise direction, as indicated by the arrows in the drawing, and spreads upwards throughout the overall area of the lid 300 before being discharged through the discharge hole 304. Of course, a cooling water circulation system, in which the discharged cooling water is again supplied to the injection hole 302 after passing through a separate process, is provided.

However, in the conventional lid with the cooling system having the above-mentioned structure, when cooling water, which is injected through the injection hole, spins in the direction indicated by the arrows of the drawing and spreads upwards, because this is backflow, that is, flow from a lower position to an upper position, the flow speed of the cooling water changes. Thereby, vortices occur. As well, because the ports interfere with the flow of the cooling water while the cooling water is discharged through the discharge hole, stagnation due to vortices occurs near curved parts of the ports.

Particularly, FIG. 4 shows that stagnation mainly occurs in portions (H) indicated by hatching. Of course, such stagnation causes a partial temperature drop in the chamber, thus resulting in a relatively sudden temperature rise, so that problems, such as defective products, may occur during a production process. Furthermore, with the passage of time, due to metal corrosion, cooling water leakage may occur.

DISCLOSURE OF INVENTION

Technical Problem

Accordingly, the present invention has been made keeping in mind the above problems occurring in the prior art, and a first object of the present invention is to provide a cooling system for a chamber of an ingot growth apparatus which prevents cooling water from creating a stationary vortex while flowing along a guide line from an injection hole to a discharge hole in a base plate constituting a chamber unit, thus providing a superior cooling effect.

A second object of the present invention is to provide a cooling system for a chamber of an ingot growth apparatus which prevents cooling water from creating a stationary vortex while flowing upwards from an injection hole towards a discharge hole in a lid constituting the chamber unit, thus increasing a cooling effect.

Technical Solution

In order to accomplish the above first object, the present invention provides a cooling system for a chamber of an ingot growth apparatus provided with a base plate, in which cooling water, injected into the base plate through an injection hole formed at a predetermined position in the base plate, flows along a guide line, having an unevenly curved shape due to an electrode rod assembly hole and a vacuum pump connection hole, and is discharged through a discharge hole, the cooling system including a plurality of guide blades provided in the base plate at positions adjacent to unevenly curved parts of the guide line around which stationary vortices occur while the cooling water flows along the guide line, thus ensuring smooth flow of the cooling water.

In order to accomplish the above second object, the present invention provides a cooling system for a chamber of an ingot growth apparatus provided with a lid in which cooling water, injected into the lid through an injection hole formed at a predetermined position in the lid, spins, spreads upwards, and passes through a plurality of ports before being discharged through a discharge hole, the cooling system including a plurality of guide blades provided in the lid at positions at which vortices occur due to a change in flow direction of the cooling water from a lower position towards an upper position and at positions adjacent to the ports which interfere with the cooling water when passing through the ports, thus ensuring smooth flow of the cooling water.

ADVANTAGEOUS EFFECTS

In the present invention, guide blades are provided in a base plate and a lid, which define a chamber, at positions at which cooling water creates stationary vortices, thus solving a problem of cooling water stagnation, thereby increasing a cooling effect.

BRIEF DESCRIPTION OF THE DRAWINGS

FIG. 1 is a front view schematically showing a typical ingot growth apparatus;

FIG. 2 is a plan view showing a base plate of a chamber unit according to a conventional technique;

FIG. 3 is a sectional view taken along line A-A of FIG. 2;

FIG. 4 is a plan view showing a lid of the chamber unit according to the conventional technique;

FIG. 5 is a plan view showing a base plate of a chamber unit, according to the present invention;

FIG. 6 is a sectional view taken along line A-A of FIG. 5;

FIGS. 7 and 8, respectively, are pictures comparing cooling water flow in the conventional base plate and in the base plate of the present invention;

FIG. 9 is a plan view showing a lid of the chamber unit according to the present invention;

FIGS. 10, 11 and 12 are pictures showing the flow of cooling water in the lid according to the conventional technique; and FIGS. 13, 14 and 15 are pictures showing the flow of cooling water in the lid according to the present invention.

DESCRIPTION OF THE ELEMENTS IN THE DRAWINGS

10: chamber unit
12: quartz crucible
14: heater
16: thermal shield wall
20: growth tower unit
22: seed crystal
100: base plate
102: injection hole
104: discharge hole
110: upper plate
120: lower plate
130: side plate
140: shaft coupling hole
150: side electrode rod assembly hole
152: lower electrode rod assembly hole
160: vacuum creation hole
170: guide line
180: guide blade
200: main body
300: lid
302: injection hole
304: discharge hole
310: observation window
320: camera port
330: diameter control port
340: polysilicon passing port
350: lift port
360: guide blade
370: pin

BEST MODE FOR CARRYING OUT THE INVENTION

Hereinafter, the present invention will be described in detail with reference to the attached drawings. Reference should now be made to the drawings, in which the same reference numerals are used throughout the different drawings to designate the same or similar components.

First, the construction of a chamber unit of an ingot growth apparatus will be explained herein below briefly for appreciation of the present invention. Typically, a chamber unit of the ingot growth apparatus includes a base plate, a main body, and a lid. Each of the base plate, the main body, and the lid has a cooling system therein to prevent it from being heated by a heater.

Furthermore, a quartz crucible, which melts polysilicon, is rotatably installed in the chamber unit. The heater is provided outside the quartz crucible to heat it. A thermal shield wall is provided outside the heater to prevent heat from being emitted to the outside of the chamber unit.

In the chamber unit having the above-mentioned construction, the present invention is characteristic of cooling systems provided in the base plate and the lid. Hereinafter, they will be explained herein below.

FIG. 5 is a plan view showing the base plate of the chamber unit, according to the present invention. FIG. 6 is a sectional view taken along line A-A of FIG. 5.

Referring to these drawings, the base plate 100 according to the present invention includes an upper plate 110 and a lower plate 120 which are spaced apart from each other by a predetermined distance such that cooling water flows in a space defined between them. The base plate 100 further includes a side plate 130 which forms the sidewall of the base plate 100 and seals it.

Furthermore, a shaft coupling hole 140, through which a shaft to rotate the quartz crucible is inserted, is formed at a central position through the base plate 100. Electrode rod assembly holes 150 and 152, through which electrode rods to heat the quartz crucible are mounted, are formed at predetermined positions through the base plate 100. As well, vacuum creation holes 160, to which a vacuum pump to create a vacuum in the chamber is connected, are formed at predetermined positions through the base plate 100. The electrode rod assembly holes 150 and 152 are classified into the side electrode rod assembly holes 150 and the lower electrode rod assembly holes 152.

The cooling system is provided in the base plate 100 having the above-mentioned structure. In detail, an injection hole 102, through which cooling water is injected into the chamber, is formed in the base plate 100 at a position adjacent to the center thereof. A discharge hole 104, through which the cooling water is discharged, is formed in the base plate 100 at a predetermined position adjacent to the outer edge of the base plate 100. Furthermore, a guide line 170 is provided in the base plate 100, such that the flow path of cooling water, which is injected through the injection hole 102, forms a spiral configuration while the cooling water flows to the discharge hole 104, thus preventing the cooling water from directly and linearly flowing towards the discharge hole 104. Therefore, cooling water, which is injected into the chamber through the injection hole 102, flows along the guide line 170 and evenly spreads throughout the overall area of the base plate 100 before being discharged through the discharge hole 104. Of course, a cooling water circulation system, in which the discharged cooling water is again supplied to the injection hole 102 after passing through a separate process, is provided.

Furthermore, in the present invention, guide blades 180 are provided in the base plate 100 at positions adjacent to unevenly curved parts of the guide line 170 to prevent the cooling water from creating a stationary vortex. In detail, the guide line 170 has an unevenly curved shape in consideration of formation of the electrode rod assembly holes 150 and 152 and the vacuum creation holes 160. While the cooling water flows along the guide line 170, stationary vortices occur at the unevenly curved parts of the guide line 170 due to a sudden change in current speed of the cooling water. To prevent this phenomenon, the guide blades 19 are provided at positions adjacent to the unevenly curved parts of the guide line 170.

The shape of each guide blade 180 is not limited to any particular shape, but it is preferable that it have a triangular or elliptical shape and be oriented in the direction in which the cooling water flows, to ensure smooth flow of the cooling water.

In the base plate of the present invention having the above-mentioned structure, because the guide blades are provided at positions adjacent to the unevenly curved parts of the guide line, stagnation due to vortices does not occur while the cooling water flows along the guide line.

This is confirmed with reference to the attached pictures of FIGS. 7 and 8. In this experiment, water mixed with hulled millet is used as cooling water. As shown in FIG. 7, in the conventional base plate, it can be seen by observing the collection of the hulled millet that there are areas where cooling water creates stationary vortices. However, as shown in FIG. 8, in the case that the guide blades (parts shown in red in FIG. 7) are used, it is shown that vortices do not occur and the stagnation problem is thus completely solved. As such, in the present invention, because cooling water can smoothly flow, a partial temperature rise is prevented, thus maintaining optimum conditions in a production process.

FIG. 9 is a plan view showing the lid of the chamber unit according to the present invention.

Referring to this drawing, the lid 300 of the present invention has a dome shape and defines therein a space in which cooling water flows.

Furthermore, an observation window 310 is provided at a predetermined position in the lid 300 to allow a user to observe the interior of the chamber unit 10. A camera port 320, a diameter control port 330, a polysilicon passing port 340, and a lift port 350 are provided at predetermined positions in the lid 300. These ports are well known to those in the art, therefore further explanation is deemed unnecessary.

The lid 300 having the above-mentioned structure has a cooling system therein. In detail, an injection hole 302, through which cooling water is supplied, is formed at a lower position in the lid 300. A discharge hole 304, through which the cooling water is discharged, is formed at an upper position in the lid 300. Thus, the cooling water, which is injected through the injection hole 302, flows in a clockwise direction, as indicated by the arrows in the drawing, and spreads upwards throughout the overall area of the lid 300 before being discharged through the discharge hole 304. Of course, a cooling water circulation system, in which the discharged cooling water is again supplied to the injection hole 302 after passing through a separate process, is provided.

Moreover, the present invention includes guide blades 360 which are provided near the ports that interfere with the flow of the cooling water, thus preventing the cooling water from creating stationary vortices. That is, when the cooling water, which is injected through the injection hole 302, spins, spreads upwards in the lid 300, and passes through the ports before being discharged through the discharge hole 304, stagnation due to vortices occurs near the ports which interfere with the flow of the cooling water. To prevent this problem, the guide blades 360 are provided at positions adjacent to the ports.

The shape of each guide blade 360 is not limited to any particular shape, but it is preferable that it have a triangular or elliptical shape and be oriented in the direction in which the cooling water flows, to ensure smooth flow of the cooling water.

Furthermore, in the present invention, six pins 370 are provided to prevent vortices from occurring due to a sudden change in current speed of the cooling water, which spreads upwards from the injection hole. The pins 370 are disposed at positions adjacent to the injection hole, and help the cooling water flow smoothly.

The number of pins 370 may be varied according to the shape of the lid or the position of each port. Each pin 370 has an appropriate size and shape such that it does not interfere with the flow of the cooling water. Preferably, each pin 370 has a cylindrical shape.

In the lid of the present invention having the above-mentioned structure, because the guide blades are provided at positions adjacent to the ports that interfere with the flow of cooling water, and the pins are provided at position adjacent to the injection hole, stationary vortices are prevented from occurring while the cooling water spreads upwards.

This is confirmed with reference to the attached pictures of FIGS. 10 and 15. In this experiment, water mixed with green dye is used as cooling water. As shown in FIGS. 10, 11 and 12, in the conventional lid, it is confirmed that vortices occur while the cooling water flows upwards from the injection hole and, thus, the cooling water does not flow smoothly. However, as shown in FIGS. 13, 14 and 15, in the case that the guide blades and the pins of the present invention are used, it is shown that vortices do not occur and, thus, a stationary vortex problem is completely solved. As such, in the present invention, because cooling water can smoothly flow, a partial temperature rise is prevented, thus maintaining optimum conditions in a production process.

Although the preferred embodiment of the present invention has been disclosed for illustrative purposes, those skilled in the art will appreciate that various modifications, additions and substitutions are possible, without departing from the scope and spirit of the invention as disclosed in the accompanying claims.

The invention claimed is:

1. An ingot growth apparatus cooling system wherein a chamber is provided with a base plate, in which cooling water, injected into the base plate through an injection hole formed in the base plate, flows along a guide line, having an unevenly curved shape due to an electrode rod assembly hole and a vacuum pump creation hole, and is discharged through a discharge hole, wherein the cooling system comprises, a plurality of guide blades provided in the base plate at positions adjacent to unevenly curved parts of the guide line around which stationary vortices occur while the cooling water flows along the guide line, thus ensuring smooth flow of the cooling water.

2. The cooling system for the chamber of the ingot growth apparatus according to claim 1, wherein each of the guide blades has a triangular or elliptical shape and is oriented in a flow direction of the cooling water.

3. An ingot growth apparatus cooling system wherein a chamber is provided with a lid in which cooling water, injected into the lid through an injection hole formed in the lid, spins, spreads upwards, and passes through a plurality of ports before being discharged through a discharge hole, wherein the cooling system comprises, a plurality of guide blades and pins provided in the lid at positions at which vortices occur due to a change in flow direction of the cooling water from a lower position towards an upper position and at positions adjacent to the ports which interfere with the cooling water when passing through the ports, thus ensuring smooth flow of the cooling water.

4. The cooling system for the chamber of the ingot growth apparatus according to claim 3, wherein each of the guide blades has a triangular or elliptical shape and is oriented in a flow direction of the cooling water.

5. The cooling system for the chamber of the ingot growth apparatus according to claim 3, wherein the pins are provided at positions adjacent to the injection hole around which a flow direction of the cooling water from the lower position towards the upper position changes, and each of the pins has a cylindrical shape.

6. An ingot growth apparatus cooling system wherein a chamber comprises a base plate, a main body, and a lid, the cooling system being provided in each of the base plate, the main body and the lid, wherein the base plate comprises: an injection hole formed in the central portion of the base plate so that cooling water is injected into the base plate through the injection hole; a discharge hole formed in the base plate adjacent to an outer edge thereof so that the cooling water is discharged through the discharge hole; a guide line provided in the base plate and guiding the cooling water such that the cooling water, injected through the injection hole, spreads throughout the base plate and forms a circular flowing path before being discharged through the discharge hole, the guide line having an unevenly curved shape due to an electrode rod assembly hole and a vacuum pump creation hole; and a plurality of guide blades provided in the base plate at positions adjacent to unevenly curved parts of the guide line around which stationary vortices occur while the cooling water flows along the guide line, thus ensuring a smooth flow of the cooling water, the lid has a dome shape and comprises: an injection hole formed at a lower position in the lid so that cooling water is injected into the lid through the injection hole; a discharge hole formed at an upper position in the lid so that the cooling water is discharged through the discharge hole; a plurality of ports provided in the lid; a plurality of pins provided in the lid at positions at which vortices occur due to a change in direction of the cooling water when the cooling water, injected through the injection hole, spins and spreads upwards; a plurality of guide blades provided in the lid at positions adjacent to the ports around which stationary vortices occur due to the ports interfering with the cooling water, which passes through the ports before being discharged through the discharge hole, thus ensuring smooth flow of the cooling water.

7. The cooling system for the chamber of the ingot growth apparatus according to claim 6, wherein each of the guide blades has a triangular or elliptical shape and is oriented in a flow direction of the cooling water.

8. The cooling system for the chamber of the ingot growth apparatus according to claim 6, wherein the pins are provided at positions adjacent to the injection hole around which a flow direction of the cooling water from the lower position towards the upper position changes, and each of the pins has a cylindrical shape.

* * * * *